United States Patent
Tseng et al.

(10) Patent No.: US 6,175,497 B1
(45) Date of Patent: Jan. 16, 2001

(54) THERMAL VIAS-PROVIDED CAVITY-DOWN IC PACKAGE STRUCTURE

(75) Inventors: T. J. Tseng, Hsinchu; David C. H. Cheng, Taoyuan Hsien, both of (TW)

(73) Assignee: World Wiser Electronics Inc., Taoyuan Hsien (TW)

(*) Notice: Under 35 U.S.C. 154(b), the term of this patent shall be extended for 0 days.

(21) Appl. No.: 09/267,885

(22) Filed: Mar. 11, 1999

(30) Foreign Application Priority Data

Sep. 30, 1998 (TW) ................................................ 87116231

(51) Int. Cl.$^7$ ........................................................ H05K 7/20
(52) U.S. Cl. ...................... 361/704; 361/705; 361/706; 361/707; 361/708; 361/717; 361/718; 361/713; 361/719; 257/706; 257/713
(58) Field of Search ............................... 361/704, 705, 361/707, 709–713, 717–719, 720, 722, 761, 764; 174/252, 16.3; 165/80.3, 185; 257/712, 713, 706, 723, 724, 778, 796

(56) References Cited

U.S. PATENT DOCUMENTS

| | | | |
|---|---|---|---|
| 5,097,318 | * | 3/1992 | Tanaka et al. ........................ 257/690 |
| 5,404,273 | * | 4/1995 | Akagawa .............................. 361/707 |
| 5,409,865 | * | 4/1995 | Karnezos ............................. 257/706 |
| 5,646,373 | * | 7/1997 | Collins et al. ....................... 361/719 |
| 5,652,463 | * | 7/1997 | Weber et al. ........................ 257/706 |
| 5,675,404 | * | 10/1997 | Nagase et al. ...................... 361/704 |
| 5,724,232 | * | 3/1998 | Bhatt et al. ......................... 361/762 |
| 5,814,883 | * | 9/1998 | Sawai et al. ........................ 257/712 |
| 5,831,825 | * | 11/1998 | Fromont .............................. 361/719 |
| 5,905,634 | * | 5/1999 | Takeda et al. ...................... 361/704 |
| 5,959,356 | * | 9/1999 | Oh ....................................... 257/738 |
| 5,990,550 | * | 11/1999 | Umezawa ............................ 257/712 |
| 6,008,536 | * | 12/1999 | Mertol ................................. 257/704 |

* cited by examiner

Primary Examiner—Gerald Tolin
Assistant Examiner—Boris L. Chervinsky
(74) Attorney, Agent, or Firm—J. C. Patents; Jiawei Huang

(57) ABSTRACT

A thermal vias-provided cavity-down IC package structure of the invention is provided. The thermal vias-provided cavity-down IC package structure includes a substrate, a heat sink and an adhesive layer for attaching the substrate to the heat sink. The substrate is formed of multiple layers of printed circuit boards which are attached to each other, and have a cavity formed at the center thereof. A plurality of thermal vias is formed surrounding the substrate. The head sink is divided into a chip mount area and a thermal via joint area. The chip mount area is used for a chip mount pad to be disposed thereon, wherein a chip is connected to the heat sink through the chip mount pad. The thermal via area is electrically coupled to the thermal vias thereby to form an approximate short path or a short path. Thus, heat energy is transferred not only by the heat sink directly, but also from the heat sink to the substrate through the thermal vias. Furthermore, since the depth of the chip mount area is adjustable, it is unnecessary to additionally grind the chip, resulting in a great saving of time and cost.

9 Claims, 3 Drawing Sheets

THERMAL VIAS-PROVIDED CAVITY-DOWN IC PACKAGE STRUCTURE

CROSS-REFERENCE TO RELATED APPLICATION

This application claims the priority benefit of Taiwan application serial no. 87116231, filed Sep. 30, 1998, the full disclosure of which is incorporated herein by reference.

BACKGROUND OF THE INVENTION

1. Field of the Invention

The invention relates to a thermal vias-provided cavity-down IC package structure, and in particular to a super high-efficiency thermal vias-provided cavity-down IC package structure.

2. Description of the Related Art

In a module including at least one integrated circuit (IC), a large number of electrically conductive wires is required to form a complete circuit for signal and power source inputs/outputs. In the past, there were many different types of IC packages. The common packages are a planar package, a hermetic and plastic chip carrier package and a grid array package.

In conventional and widely used IC packages, a lead frame is used to electrically connect a semiconductor chip and the external leads of a package. Since ICs are becoming increasingly more precise and complicated, the number of wires required is greatly increased with the sizes of packages remaining the same or being reduced. Therefore, the conventional lead frame cannot meet practical requirements. To resolve this problem, a new type of IC package for containing a greater number of wires is urgently required to complete more complicated circuits.

Accordingly, a ball grid array (BGA) IC package used to contain a greater number of wires was introduced. In general, BGA is a square package where solder balls are used for external electrical connections instead of lead pins. The solder balls are used to electrically connect to a printed wire board, a printed circuit board or bonding pads of other ICs.

In practice, a conventional BGA substrate is a small, double-layer or multi-layer, printed circuit board. A chip is electrically connected to the BGA substrate through a plurality of wires. Moreover, electrical connections between conductive layers in the BGA substrate are completed via plated-through-holes or metal plugs.

FIG. 1 is a schematic, cross-sectional view illustrating a cavity-down BGA IC package structure which is disclosed in U.S. Pat. No. 5,357,672 issued to LSI Logic Corporation. As shown in FIG. 1, three layers of printed wire boards 100, 102 and 104 are attached to each other through prepregs 106, 108 and 110 with a cavity 111 formed therein. A chip 112 is disposed at the center of the cavity, and is surrounded by trapezoidal edges of the 3-layer printed wire board. The trapezoidal edges are designed with bonding pads 114 and 116 thereon. Bonding pads 118 surrounding the chip 112 are electrically connected to the bonding pads 114 and 116 through bonding wires 120, and then to bumps 124 through plated through hole 122 for a signal transmission with a main board (not shown). A heat sink 130 is disposed on the back of the chip 112 for heat transfer.

In this patent, the three layers of printed wire boards 100, 102 and 104 attached to each other through prepregs 106, 108 and 110 serve as a substrate, and the cavity 111 formed in the substrate is chiefly used to contain the chip 112. Therefore, the bumps 124 can be formed on the same side as the chip 112. Compared to a general BGA IC package with a chip and bumps formed on two opposite sides, two conductive layers are saved.

In a conventional cavity-down BGA, PGA (Pin Grid Array) or multi-chip module (MCM) IC package, at least two conductive layers, such as conductive layers 126 and 128 shown in FIG. 1, are formed in a multi-layer printed wire boards serving as a substrate, with a cavity formed in the multi-layer printed wire board. Since a general chip has a thickness approximately equal to or greater than that of the substrate and the chip and solder balls are located on the same side, the contact between the solder balls and a main board is hindered during bonding and molding. For this reason, in a conventional cavity-down IC package, a chip is generally ground to have a thickness ranging from 10 to 25 mil. However, wafers are easily broken during grinding, resulting in an expensive loss of material.

Furthermore, in the conventional cavity-down BGA, PGA or MCM IC package, only one planar heat sink, such as the one 130 shown in FIG. 1, is disposed on the back of a chip. However, this heat sink design cannot meet requirements for highly integrated, high-speed ICs where a great amount of heat is generated, and all devices formed in the ICs are extremely sensitive to temperature.

SUMMARY OF THE INVENTION

In view of the above, an object of the invention is to provide a thermal vias-provided cavity-down IC package structure where a chip mount pad is directly attached to a heat sink made of metal, thermally conductive ceramics or polymer through a silver paste, thereby forming a most direct and short thermally conductive path to a carried chip. Thus, part of heat energy can be further transferred from thermal vias distributed close to the heat sink by plated-through-holes, bonding pads and solder balls of a substrate to a motherboard on which the substrate is mounted, thereby enhancing heat transfer efficiency.

Another object of the invention is to provide a thermal vias-provided cavity-down IC package structure in which a heat sink is designed as a concave shape in coordination with thicknesses of a chip and a substrate for easy bonding and molding. In addition, the structure is also suitable for conventional BGA, PGA, CSP (Chip Scale Package) and MCM IC packages.

The thermal vias-provided cavity-down IC package structure of the invention includes a substrate, a heat sink and an adhesive layer for attaching the substrate and the heat sink. The substrate is formed of multiple layers of printed circuit boards which are attached to each other, and have a cavity formed at the center thereof. A plurality of thermal vias is formed surrounding the substrate. The head sink is divided into a chip mount area and a thermal via joint area. The chip mount area is used for a chip mount pad to be disposed thereon, wherein a chip is connected to the heat sink through the chip mount pad. The thermal via area is electrically coupled to the thermal vias thereby to form an approximate short path or a short path. Thus, heat energy is transferred not only by the heat sink directly, but also from the heat sink to the substrate through the thermal vias.

BRIEF DESCRIPTION OF THE DRAWINGS

The invention will be more fully understood from the detailed description given hereinbelow and the accompanying drawings which are given by way of illustration only, and thus do not limit the present invention, and wherein.

DETAILED DESCRIPTION OF THE PREFERRED EMBODIMENTS

Figure 1:
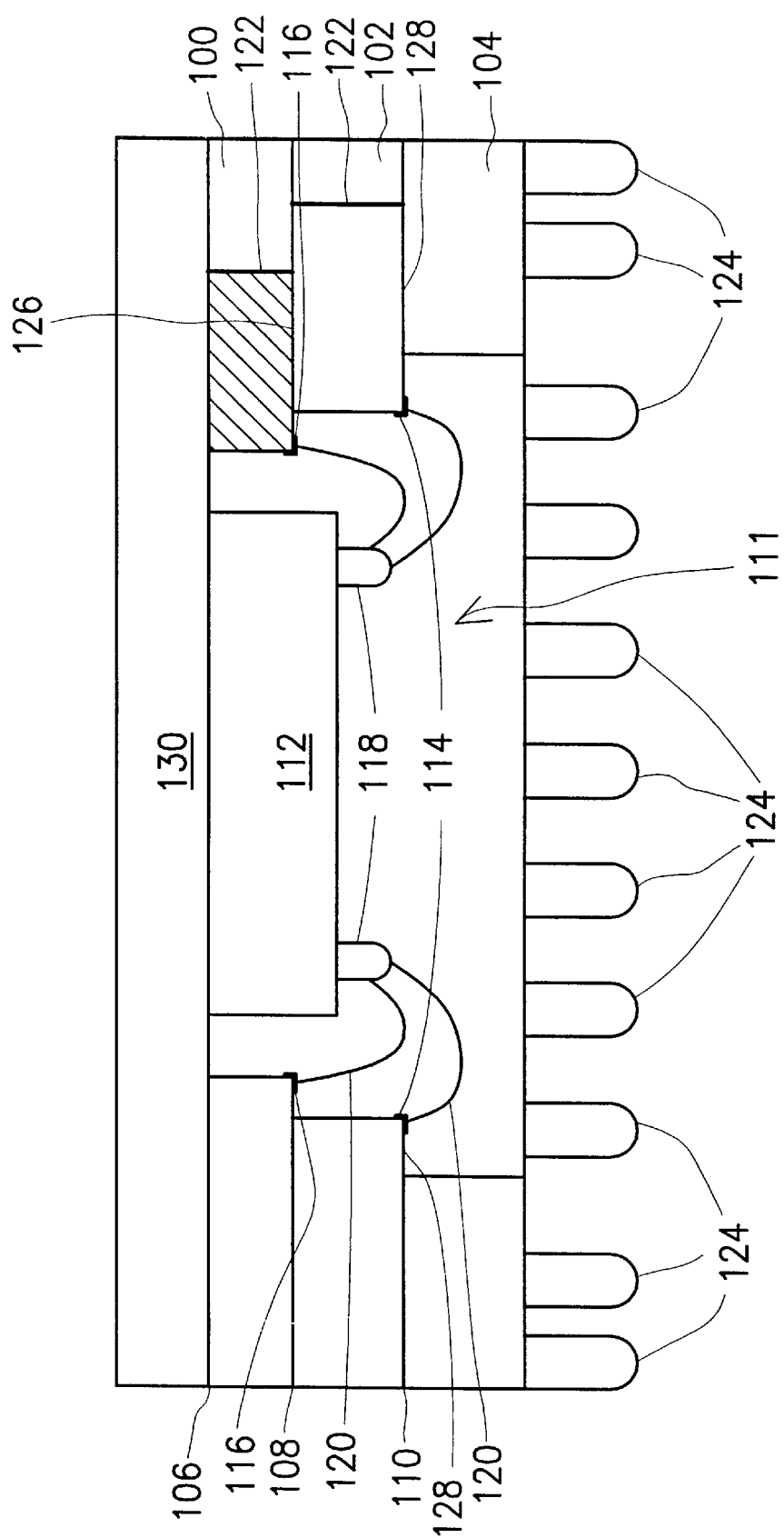
FIG. 1 is a schematic, cross-sectional view illustrating a conventional BGA IC package structure.
Figure 2:
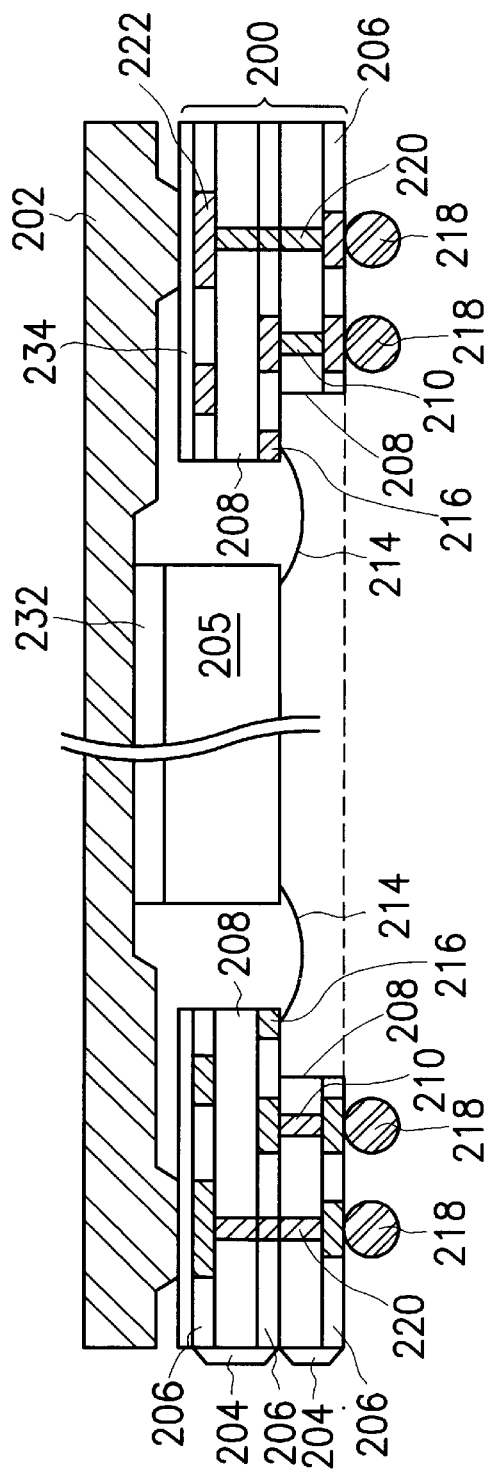
FIG. 2 is a schematic, cross-sectional view illustrating a thermal vias-provided cavity-down IC package structure according to a preferred embodiment of the invention.

FIG. 2 is a schematic, cross-sectional view illustrating a thermal vias-provided cavity-down IC package structure according to a preferred embodiment of the invention. The thermal vias-provided cavity-down IC package structure includes a substrate 200, a heat sink 202 and a chip 205.

Figure 3:
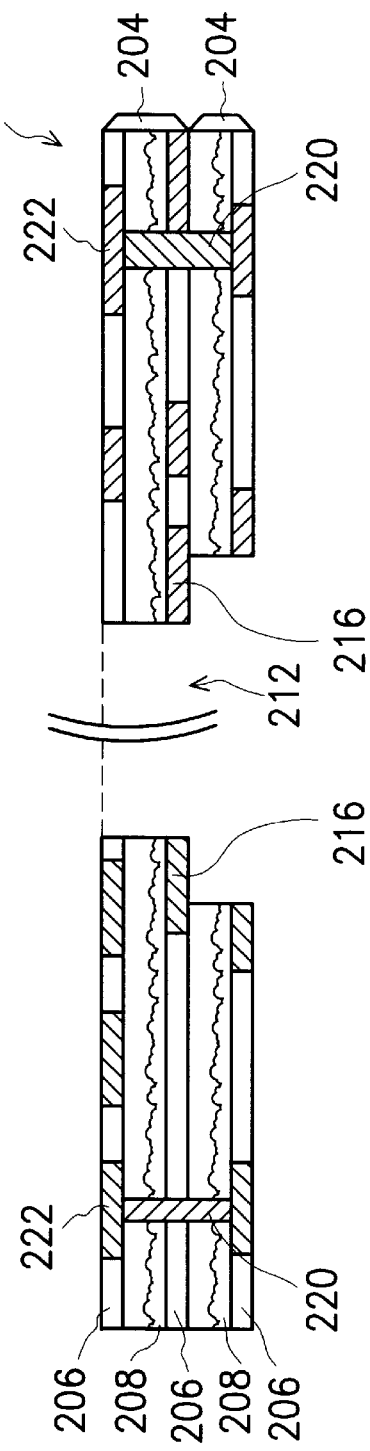
FIG. 3 is a detailed, schematic, cross-sectional view illustrating a substrate of FIG. 2.

FIG. 3 is a detailed, schematic, cross-sectional view illustrating the substrate 200 of FIG. 2. As shown in FIG. 3, the substrate 200 consists essentially of multiple layers of printed circuit boards 204 attached to each other through prepregs (not shown), such as Fr-4, Fr-5, bismalemide triazine (BT) Prepreg) or polyphenylene ether (PPE). Each printed circuit board 204 includes a metal layer 206, such as a copper layer, and an epoxy layer 208. The metal layers 206 among the printed circuit boards 204 are electrically interconnected by plated-through-holes 210. In the embodiment, only two layers of printed circuit boards 204 are shown for description, but it is not intended to limit the invention. Moreover, a cavity 212, which is formed at the center of the substrate 200, is used to contain a chip 205 and wires 214. The wires 214 electrically connect the substrate 200 and the chip 205. The chip 205 is surrounded by trapezoidal edges of the substrate 200 where a number of bonding pads 216 is exposed. Obviously, the bonding pads 216 are electrically coupled to bonding pads (not show) of the chip 205 through the wires 214. In addition, a number of solder balls 218 is formed on one side of the substrate 200. After an entire IC package is completed, the IC is mounted on a motherboard (not shown) by the solder balls 218. Thus, signal and power source inputs/outputs between the chip 205 and outside can be implemented through the bonding pads, wires, metal layers, plated-through-holes, solder balls and motherboard.

Unlike the prior art, a plurality of thermal vias 220, like the plated-through-holes 210, is formed surrounding the substrate 200, and these thermal vias 220 are used to punch through the entire substrate 200. The method of forming the thermal vias 220 depends on the type of the substrate 200. If the substrate 200 is a conventional multi-layer printed circuit board, the thermal vias 220 are formed by a general drilling method. If the substrate 200 is a high-density interconnection board, the thermal vias are formed by a micro via technique, such as a laser via, photo via or plasma via technique. After that, the thermal vias 220 are plated full with epoxy plugs or metal plugs. Then, the epoxy plugs or metal plugs are hardened. A metal pad 222, which is formed on one end of each plated thermal via 220, is used to connect the heat sink 202. A solder ball 218, which is formed on the other end of each plated thermal via 220, is used to connect with the motherboard.

Figure 4:
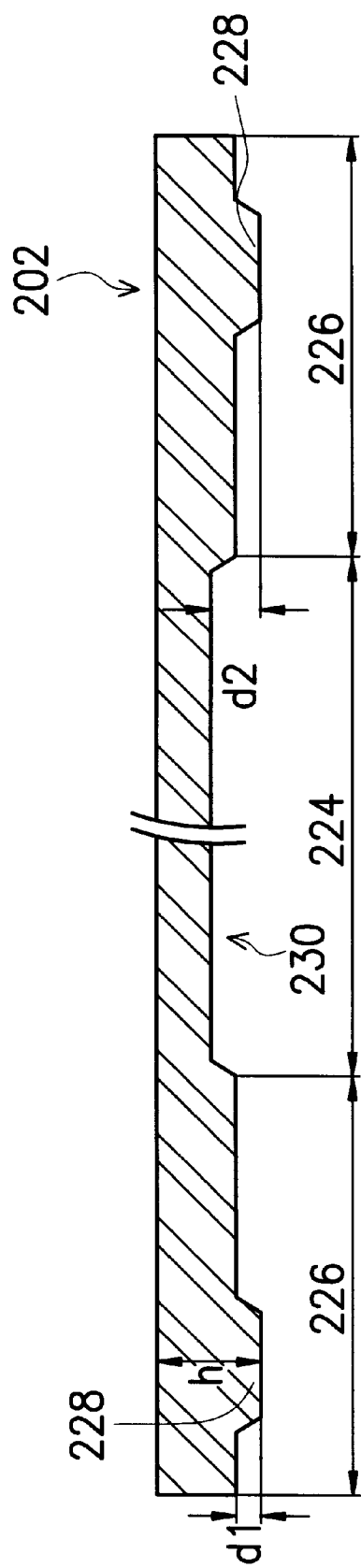
FIG. 4 is a detailed, schematic, cross-sectional view illustrating a heat sink of FIG. 2.

FIG. 4 is a detailed, schematic, cross-sectional view illustrating the heat sink 202 of FIG. 2. The heat sink 202 is made of metal (such as copper (Cu), aluminum (Al) or other alloy) or ceramics (such as aluminum oxide ($Al_2O_3$), magnesium oxide (MgO), silicon carbide (SiC)) or polymer with a better thermal conductivity. The heat sink has a thickness h of approximately 6–60 mil, and is mainly divided into a chip mount area 224 and a thermal via joint area 226. As shown in FIG. 4, the chip mount area 224 and the thermal via joint area 226 including the island-shaped protrusions 228 are made of the metal as a single body. The thermal via joint area 226 has a plurality of island-shaped protrusions 228, each of which is opposite one of the thermal vias 220 shown in FIG. 3. Each protrusion 228 has a height of about 0.2–3.0 mil, and is attached to a corresponding thermal via 220. In coordination with the thicknesses of the chip 205 and the substrate 200, the chip mount area 224 for containing the chip 205 can be optionally designed into a concave structure 230 with a depth d2 of about 40 mil for easy bonding and molding. Since it is unnecessary to grind the chip 205, manufacturing yield is increased. The concave structure 230 is used to carry a chip mount pad 232 shown in FIG. 2 on which the chip 205 is mounted.

Additionally, the island-shaped protrusions 228 and the concave structure 230 of the heat sink 202 can be formed by photolithography plus chemical etching, molding or extrusion. The surface of the heat sink 202 is roughed by grease-removing, cleaning and brushing or chemical etching for a better adhesion between the chip mount pad 232 and the concave structure 230. Alternatively, the heat sink 202 adheres to the substrate 200 through a silver paste 234 shown in FIG. 2.

The silver paste 234 can be made of bismalemide triazine (BT) prepreg, aramid or polyphenylene ether (PPE). The substrate 200 consisting essentially of multiple layers of printed circuit boards adheres to the heat sink 202 through the silver paste 234 in an environment or in a vacuum chamber with a high temperature and a high pressure. Thereafter, the package structure of FIG. 2 can be obtained after mounting the chip 205, bonding, molding and solder ball placement processes.

In practical applications, the island-shaped protrusions 228 of the head sink 202 adhere to the metal pads 222 through the prepreg or adhesive 234 to form a short path or an approximate short path, resulting in the formation of a short heat transfer path. As a result, part of heat energy can be efficiently transferred to the motherboard through the thermal holes 220, metal pads 222 and solder balls 218.

Furthermore, the concave structure 230 is optionally formed to allow the chip 205 to directly adhere to the heat sink 202. That is, the depth of the chip mount area 224 is adjustable. Therefore, a thicker chip can be adopted without additional grinding. Accordingly, the thermal vias-provided cavity-down IC package structure of the invention not only increases production flexibility and manufacturing yield, simplifies process, and enhances electrical performance, but also can be applied in the conventional cavity-down BGA, PGA, MCM and CSP IC packages.

While the invention has been described by way of example and in terms of the preferred embodiment, it is to be understood that the invention is not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A thermal vias-provided cavity-down IC package structure, used to package a chip, comprising:

a substrate consisting essentially of multiple layers of printed circuit boards which have a cavity at the center thereof, a plurality of metal layers between neighboring printed circuit boards, a plurality of plated-through-holes for electrically interconnecting the metal layers, a plurality of thermal vias in addition to the plated-through-holes for electrically interconnecting the metal layers in the surrounding thereof, and a plurality of bonding pads on the edges thereof for electrically connecting the chip;

a heat sink having a chip mount area and a thermal via joint area, wherein the chip mount area is used to carry a chip mount pad by which the chip is connected to the heat sink, and the thermal via joint area comprises a plurality of island-shaped protrusions attached to the thermal vias which penetrate through the substrate to form a short path for heat transfer, the chip mount area and the thermal via joint area including the island-shape protrusions, said island-shape protrusions are formed as a single body with said heat sink; and a prepreg for attaching the heat sink and the substrate to each other.

2. The thermal vias-provided cavity-down IC package structure as set forth in claim 1, further comprising a thermally conductive epoxy which is used to fill the thermal vias.

3. The thermal vias-provided cavity-down IC package structure as set forth in claim 1, further comprising a metal paste used to fill the thermal vias.

4. The thermal vias-provided cavity-down IC package structure as set forth in claim 1, wherein the island-shaped protrusions are attached the thermal via through a prepreg layer.

5. The thermal vias-provided cavity-down IC package structure as set forth claim 1, wherein the chip mount area has a concave structure.

6. The thermal vias-provided cavity-down IC package structure as set forth in claim 1, further comprising a metal pad formed on one end of each thermal via for attaching the thermal via area through the prepreg and a solder ball formed on the other end of each thermal via for connecting a motherboard.

7. The thermal vias-provided cavity-down IC package structure as set forth in claim 1, wherein the heat sink is made of a highly thermally conductive material.

8. The thermal vias-provided cavity-down IC package structure as set forth in claim 7, wherein the highly thermally conductive material comprises aluminum oxide, magnesium oxide, aluminum nitride and silicon carbide.

9. The thermal vias-provided cavity-down IC package structure as set forth in claim 1, wherein the material used to form the heat sink is selected from the group consisting of copper, copper alloy, aluminum alloy, aluminum oxide, magnesium oxide, aluminum nitride and silicon carbide.

* * * * *